United States Patent
Song et al.

(10) Patent No.: US 10,667,439 B1
(45) Date of Patent: May 26, 2020

(54) DISCRETE POWER COMPONENT ASSEMBLY

(71) Applicant: Franklin Electric Co., Inc., Fort Wayne, IN (US)

(72) Inventors: Wei Song, Fort Wayne, IN (US); Zachary K. Foster, Spencerville, IN (US)

(73) Assignee: Franklin Electric Company, Inc., Fort Wayne, IN (US)

( * ) Notice: Subject to any disclaimer, the term of this patent is extended or adjusted under 35 U.S.C. 154(b) by 0 days.

(21) Appl. No.: 16/178,039

(22) Filed: Nov. 1, 2018

(51) Int. Cl.
| | |
|---|---|
| *H05K 7/20* | (2006.01) |
| *H05K 1/18* | (2006.01) |
| *H05K 3/32* | (2006.01) |
| *H02K 11/33* | (2016.01) |
| *H05K 1/02* | (2006.01) |

(52) U.S. Cl.
CPC ............ *H05K 7/209* (2013.01); *H02K 11/33* (2016.01); *H05K 1/0203* (2013.01); *H05K 1/181* (2013.01); *H05K 3/32* (2013.01); *H05K 2201/10166* (2013.01)

(58) Field of Classification Search
None
See application file for complete search history.

(56) References Cited

U.S. PATENT DOCUMENTS

| | | | |
|---|---|---|---|
| 5,065,280 A | 11/1991 | Kamezos et al. | |
| 5,373,418 A * | 12/1994 | Hayasi | H01L 23/4006 |
| | | | 257/718 |
| 5,497,289 A * | 3/1996 | Sugishima | H02M 7/003 |
| | | | 318/558 |
| 7,206,204 B2 * | 4/2007 | Nakatsu | H01L 23/4006 |
| | | | 165/80.3 |
| 7,417,861 B2 * | 8/2008 | Kikuchi | H01L 25/162 |
| | | | 361/718 |
| 7,679,915 B2 * | 3/2010 | Isomoto | H02M 7/003 |
| | | | 165/185 |
| 9,025,334 B2 * | 5/2015 | Enami | H05K 3/306 |
| | | | 361/707 |
| 2008/0158823 A1 * | 7/2008 | Tominaga | B60R 16/0239 |
| | | | 361/709 |
| 2008/0158824 A1 * | 7/2008 | Aoki | H01L 23/24 |
| | | | 361/711 |

(Continued)

OTHER PUBLICATIONS

Extended European Search Report for corresponding EP application No. 19206689, dated Mar. 3, 2020, 11 pages.

*Primary Examiner* — Courtney L Smith
(74) *Attorney, Agent, or Firm* — Faegre Drinker Biddle & Reath LLP (57) ABSTRACT

A motor drive and a discrete power component assembly. The motor drive has a motherboard; a controller; a heat sink; and a discrete power component assembly mounted to the motherboard, the discrete power component assembly includes two discrete power components, a motherboard facing plate intermediate the motherboard and the two discrete power components, the motherboard facing plate adjacent planar surfaces of the two discrete power components, and a heat sink facing plate adjacent planar surfaces of the two discrete power components which are opposite the planar surfaces adjacent the motherboard facing plate. The heat sink is secured to the motherboard with the discrete power component assembly therebetween.

11 Claims, 12 Drawing Sheets

(56) References Cited

U.S. PATENT DOCUMENTS

| | | | |
|---|---|---|---|
| 2009/0086437 A1* | 4/2009 | Tsuyuno | H05K 1/141 |
| | | | 361/709 |
| 2013/0119908 A1* | 5/2013 | Harada | H02P 6/10 |
| | | | 318/400.42 |
| 2014/0218869 A1 | 8/2014 | Yamanaka et al. | |
| 2014/0299982 A1 | 10/2014 | Minamio et al. | |
| 2015/0319890 A1 | 11/2015 | Tramet et al. | |
| 2016/0044825 A1* | 2/2016 | Baer | H05K 7/20436 |
| | | | 361/714 |

* cited by examiner

DISCRETE POWER COMPONENT ASSEMBLY

CROSS-REFERENCE TO RELATED APPLICATIONS

None.

FIELD OF THE DISCLOSURE

A discrete power component assembly including a group of power components and a motor drive including a discrete power component assembly secured to a motherboard.

BACKGROUND OF THE DISCLOSURE

Fluid pumping systems use motor drives to drive motors and pumps and transfer fluids. Fluids include liquids and gases, such as air. Fluid pumping systems are used in water wells, to extract liquids and gases from the earth, to boost pressures in pipelines, to transfer air and cooling liquids in HVAC systems, and in many other applications.

Motor drives may comprise variable frequency drives and other types of drives. Generally, an input voltage is provided to the motor drive and the motor drive converts the input voltage to a motor voltage to control the speed of the motor. In a variable frequency drive a typical input voltage is a constant frequency AC voltage, which is converted to DC voltage and the DC voltage is inverted to variable frequency AC voltage, Thus, a motor drive may include a converter, such as a bridge rectifier, a power factor correction circuit (PFC), and an inverter, which includes gated power switches. The inverter and the converter generate heat, which may be significant, due to switching inefficiencies and impedances of the components which rectify or invert the voltages.

It is known to mount individual semiconductor power components (e.g. diode, MOSFET, IGBT, BJT, Thyristor, GTO or JFET) on a circuit board. Each individual semiconductor power component has an individually packaged semiconductor power die and may be referred to as a discrete power component. A discrete power switch, such as an IGBT, may also comprise an antiparallel or freewheeling diode connected to its power leads. Accordingly, discrete power components generally comprise two power leads with or without a control or gate lead. Individually mounting discrete power components requires additional steps to mount each discrete power component in a way that insulates the remaining components of the circuit board, which typically include low-voltage control components, electrically and thermally.

Power modules are also known. In a power module multiple semiconductor power dies are connected together in a single package and are arranged in various topologies. Examples of power module modules include bridge rectifiers containing four (single-phase) or six (three-phase) diodes, H-Bridges (four switches and the corresponding antiparallel diodes), boost or power factor correction circuits (switches with antiparallel diodes and high frequency rectifying diodes), and three-phase inverters (six switches and corresponding antiparallel diodes). Power modules are sold in standard topologies and power ratings.

Improvements are desirable to increase the reliability and availability, and to lower the cost of motor drives.

SUMMARY OF THE DISCLOSURE

Embodiments of a motor drive and a discrete power component assembly are provided. In some embodiments, the motor drive includes a motherboard; a controller mounted on the motherboard; a heat sink; and a discrete power component assembly mounted to the motherboard, the discrete power component assembly including: two discrete power components, a motherboard facing plate intermediate the motherboard and the two discrete power components, the motherboard facing plate adjacent planar surfaces of the two discrete power components; and a heat sink facing plate adjacent planar surfaces of the two discrete power components which are opposite the planar surfaces adjacent the motherboard facing plate. The discrete power component assembly is positioned between the heat sink and the motherboard.

In some variations of the present embodiment, the heat sink facing plate comprises a metal substrate and a thermal interface layer.

In some variations of the present embodiment, the metal substrate comprises an aluminum plate.

In some variations of the present embodiment, a thermal interface layer is placed between the discrete power component assembly and the heat sink.

In some variations of the present embodiment, the two discrete power components comprise a plurality of discrete power switches configured in an inverter topology, and the motherboard comprises control components configured to generate gating signals to control the power switches.

In some variations of the present embodiment, each of the two discrete power components comprises an individually packaged power switch.

In some embodiments, a discrete power component assembly comprises: two discrete power components; a motherboard facing plate adjacent planar surfaces of the two discrete power components; and a heat sink facing plate adjacent planar surfaces of the two discrete power components which are opposite the planar surfaces adjacent the motherboard facing plate. In one example, an adhesive is intermediate the heat sink facing plate and the planar surfaces of the two discrete power components, the adhesive provided to bond the two discrete power components to the heat sink facing plate. It should be understood that an assembly including two discrete power components may also include additional discrete power components.

In some variations of the present embodiment, the motherboard facing plate comprises a metal substrate and a thermal interface layer.

In some variations of the present embodiment, a thermal interface layer is placed between the discrete power component assembly and the heat sink.

In some variations of the present embodiment, the two discrete power components comprise a plurality of individually packaged power switches configured in an inverter topology.

In some variations of the present embodiment, each of the two discrete power components comprises an individually packaged semiconductor power die.

DESCRIPTION OF THE DRAWINGS

The features and advantages of the disclosure will become more readily appreciated as the same become better understood by reference to the following detailed description when taken in conjunction with the accompanying drawings, where.

Corresponding reference characters indicate corresponding parts throughout the several views. Although the drawings represent embodiments of various features and components according to the present disclosure, the drawings are not necessarily to scale and certain features may be exaggerated in order to better illustrate and explain the present disclosure.

DETAILED DESCRIPTION

For the purposes of promoting an understanding of the principles of the invention, reference will now be made to the embodiments illustrated in the drawings, which are described below. The embodiments disclosed herein are not intended to be exhaustive or limit the claims to the precise form disclosed in the following detailed description. Rather, the embodiments are chosen and described so that others skilled in the art may utilize their teachings. It will be understood that no limitation of the scope of the claims is thereby intended.

Embodiments of discrete power component assemblies, a method to assemble the component groups, and a method to assemble a motor drive including the discrete power component assemblies are described below. Use of discrete power component assemblies has several benefits over use of power modules or discrete power components mounted on a mother board. Among the benefits are increased reliability due to increased heat capacity, lower cost, lower manufacturing cost of assembly vis a vis discrete components, increased reliability due to avoidance of burr piercing, which mitigates instances of dielectric failures, and stress relief during thermal expansion and contraction due to bent leads. Another benefit is the availability of discrete components build customized discrete power component assemblies in contrast with standard power modules. One or more of these advantages can be obtained by designing discrete power component assemblies with one or more of the structural features described below.

Except where a contrary intent is expressly stated, terms are used in their singular form for clarity and are intended to include their plural form.

As used herein, the terms "comprising" and "including" denote an open transition meaning that the claim in which the open transition is used is not limited to the elements following the transitional term.

Figure 1:
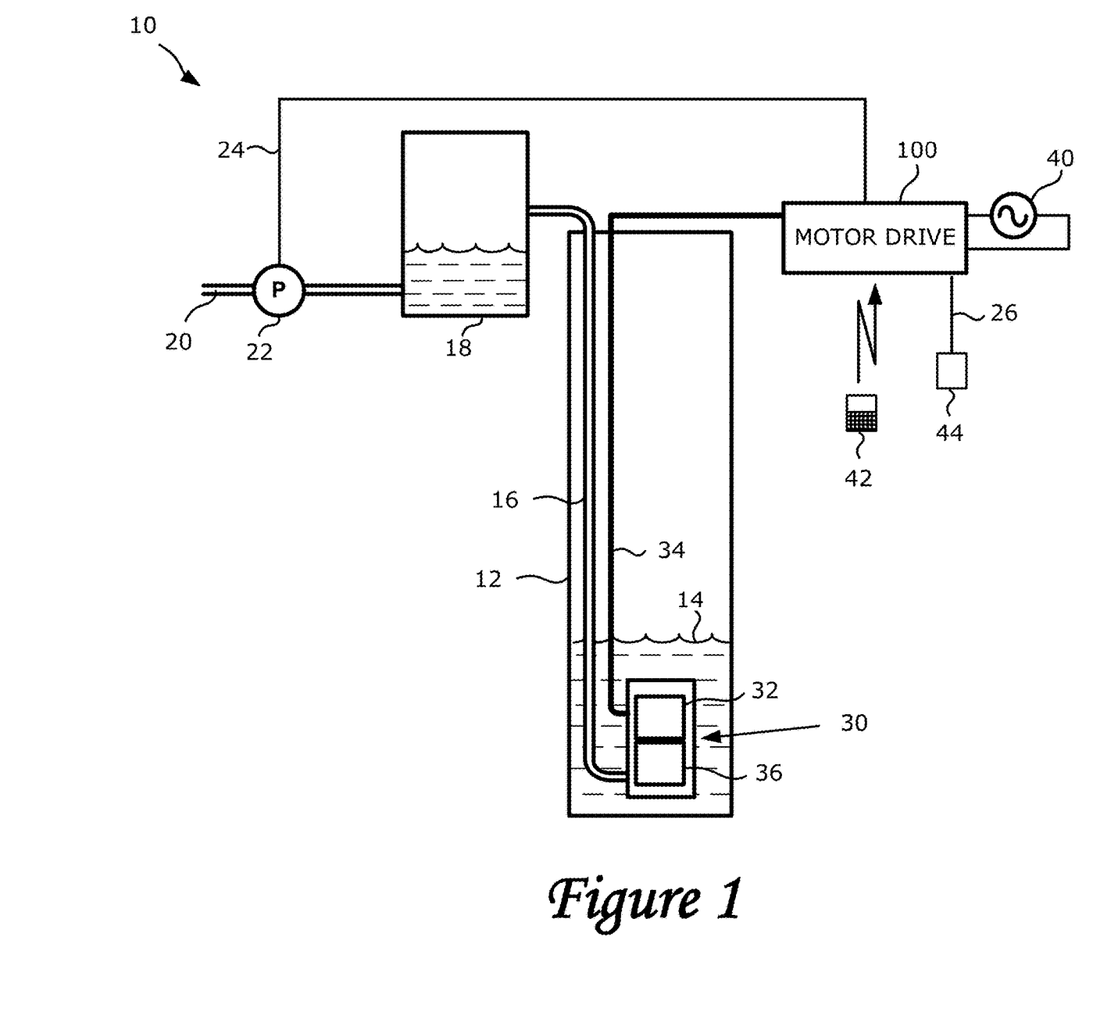
FIG. 1 is a diagrammatic view of a liquid supply system including a motor drive enclosed in a housing.

The foregoing exemplary embodiments of the disclosure will now be described with reference to the figures. Referring to FIG. 1, a diagrammatic representation of a liquid supply system 10 is disclosed. Example liquids include water, gasoline fuel, diesel fuel, petroleum, oil, sewage, and combinations of such liquids with gases and solids, such as water and coal-based methane gas. Although the embodiments below may be described with reference to water, the invention is not so limited and the principles and advantages thereof may be applicable to any liquid. Liquid supply system 10 comprises a reservoir 12 containing water 14 which is pumped by a pump unit 30 through a conduit 16, optionally via a reservoir 18, e.g. a pressure tank, to a conduit 20 of a closed system. Pump unit 30 includes a pump 36 driven by a motor 32 which is powered by a motor drive 100 via power conductors 34. The size of reservoir 12, which is interposed between pump unit 30 and a pressure sensor, affects the response of the system. In one example, motor drive 100 is a variable frequency drive (VFD) and pump 36 is a conventional centrifugal pump. Power conductors 34 may comprise two or more wires to provide single or three phase power to motor 32.

During operation of the system, water 14 flows out of conduit 20. For example, the system may be a water system in a home, in which case water flows out of conduit 20 when a faucet is opened or an irrigation system is turned on. Constant pressure ensures the heads of the irrigation system spray at a constant distance from the head to provide even and predictable irrigation. Fluid characteristics including pressure may be monitored with a pressure sensor 22 disposed in conduit 20 to generate a pressure signal useful to maintain pressure about a setpoint. The pressure signal is provided via line 24 connecting pressure sensor 22 and motor drive 100. An exemplary input device 60 is also shown. Input device 60 is provided to receive, from a user, input parameters such as setpoints and schedules. Input device 60 may comprise a smart device wirelessly coupled to a motor drive. Example smart devices include computers, smart phones and tablets. Reservoir 12 may be an aboveground or underground tank, a well casing, or any other reservoir containing water 14. A sensor 44 is electrically coupled to motor drive 100 by a cable 26.

Figure 2:
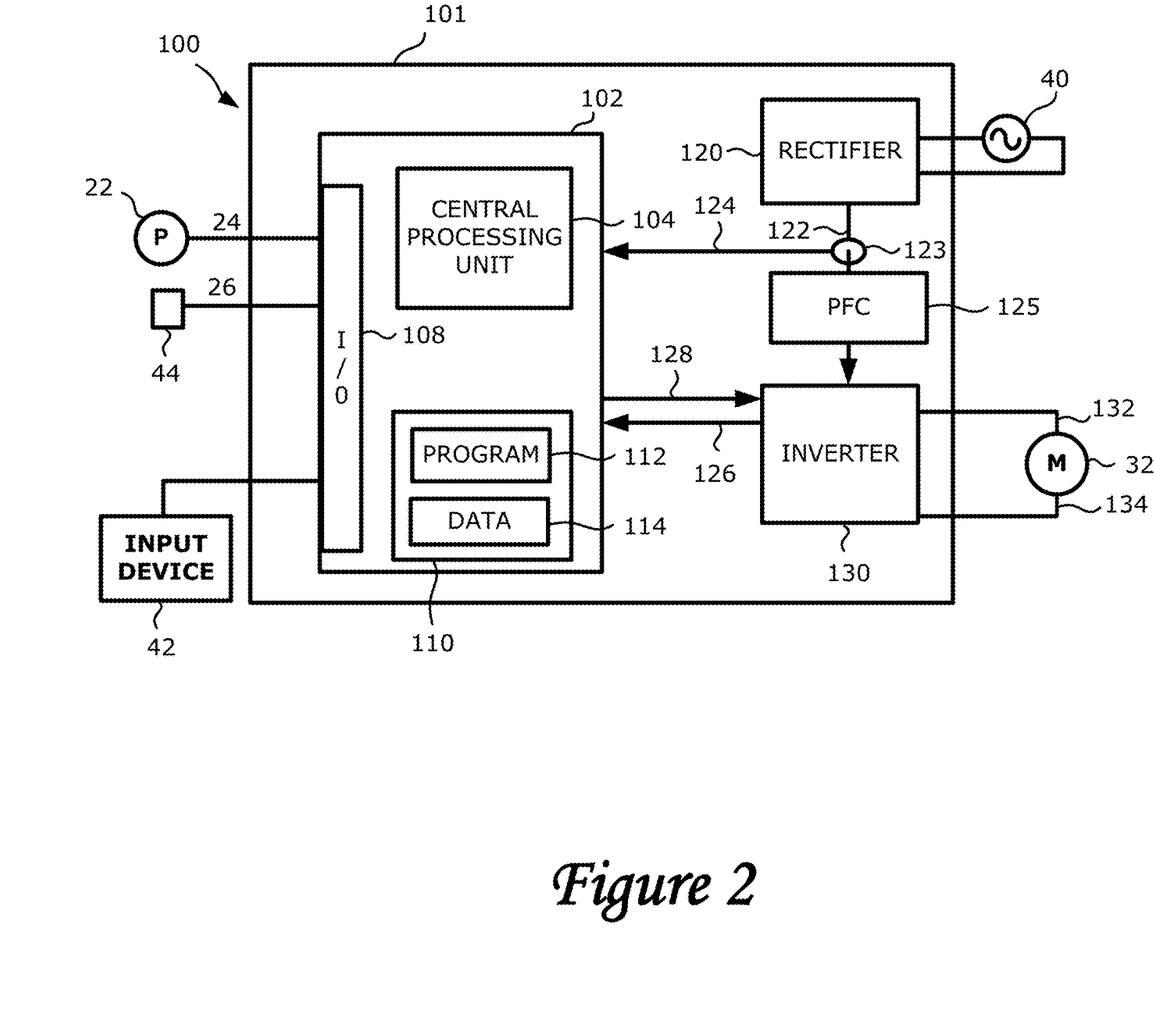
FIG. 2 is a schematic view of a motor drive.

FIG. 2 illustrates an embodiment of motor drive 100 comprising a motherboard 101 including a controller 102, a rectifier 120, an optional power factor correction circuit (PFC) 125, and an inverter 130. As shown, controller 102 includes a CPU 104 configured to access a memory device 110 and execute processing instructions from a software application, exemplified by program 112, based on data 114. Techniques for generating motor voltages according to characteristics of a control voltage are known in the art. In one example, a technique comprises storing values in a table corresponding to samples of an operating curve. The operating curve is typically a substantially straight line defining a volts-hertz relationship. When the speed control system determines a desired operating speed, which defines an operating frequency, the motor drive looks up a voltage corresponding to the frequency. The motor drive then generates a motor voltage based on the voltage and the frequency. In another example, a formula or a function embodying the operating curve characteristics is used by CPU 104 to generate the desired motor voltages.

Rectifier 120 is powered by a power source 40 and includes any rectification circuit well known in the art, e.g. a diode bridge, to convert alternating-current (AC) voltage supplied by power source 40 into direct-current (DC) voltage which it supplies to inverter 130. Inverter 130 receives DC power from rectifier 120 through a conductor 122 and converts the DC power into an AC motor power.

CPU 104 receives inputs through an I/O interface 108 and outputs a control voltage over line 128 to inverter 130. In one example, the control voltage is provided to a pulsewidth-modulated (PWM) module having power switches and control logic which generates the appropriate gating signals for the power switches to convert the DC power supplied by rectifier 120 to the AC motor voltage suitable to drive motor 32 according to the control voltage, provided to motor 32 via conductors 132, 134. Current drawn by inverter 130 from rectifier 120 is sensed by a current sensor 123 and a current signal is provided by current sensor 123 to CPU 104 by conductor 124. Motor voltage feedback can also be provided, for example through conductor 126 connecting inverter 130 and controller 102. Motor voltages may also be generated with other known or later developed drive topologies programmed in accordance with embodiments of the disclosure.

In a more general embodiment, the controller comprises control logic operable to generate the control voltage. The term "logic" as used herein includes software and/or firmware executing on one or more programmable processors, application-specific integrated circuits, field-programmable gate arrays, digital signal processors, hardwired logic, or combinations thereof. Therefore, in accordance with the embodiments, various logic may be implemented in any appropriate fashion and would remain in accordance with the embodiments herein disclosed. A non-transitory machine-readable medium comprising logic can additionally be considered to be embodied within any tangible form of a computer-readable carrier, such as solid-state memory, magnetic disk, and optical disk containing an appropriate set of computer instructions and data structures that would cause a processor to carry out the techniques described herein. A non-transitory computer-readable medium, or memory, may include random access memory (RAM), read-only memory (ROM), erasable programmable read-only memory (e.g., EPROM, EEPROM, or Flash memory), or any other tangible medium capable of storing information.

Figure 3:
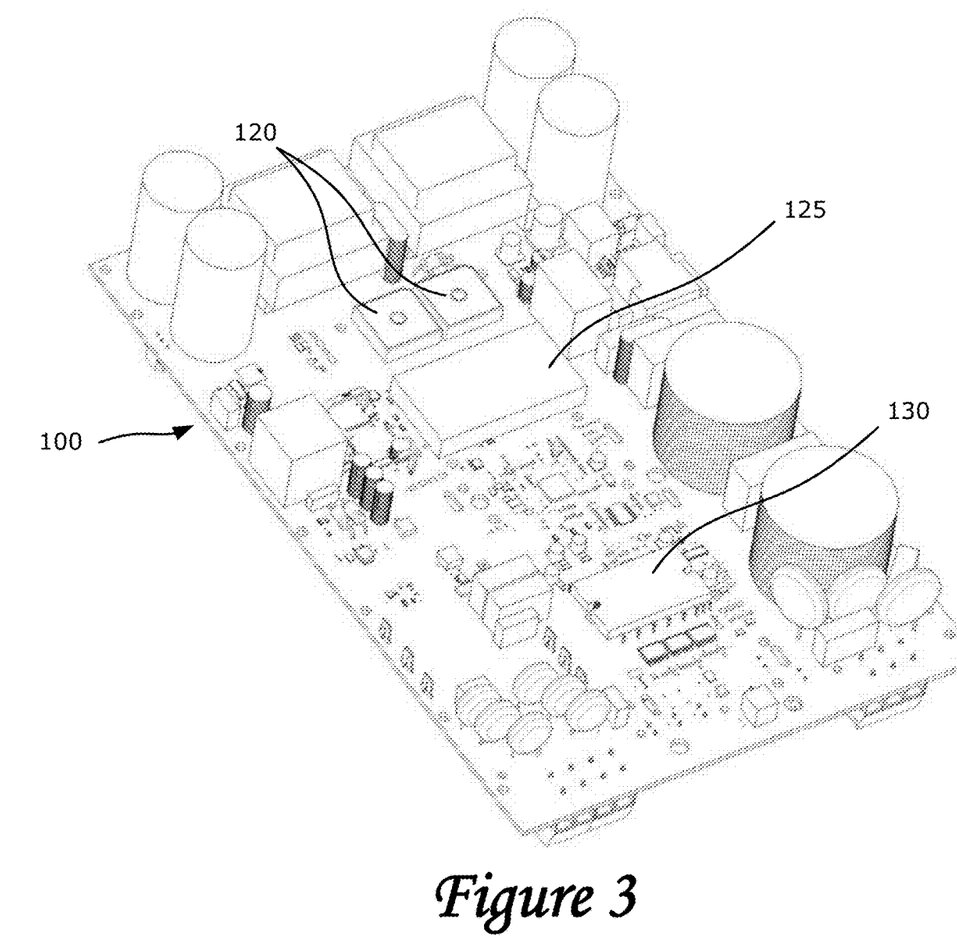
FIG. 3 is a top perspective view of a motor drive motherboard.
Figure 4:
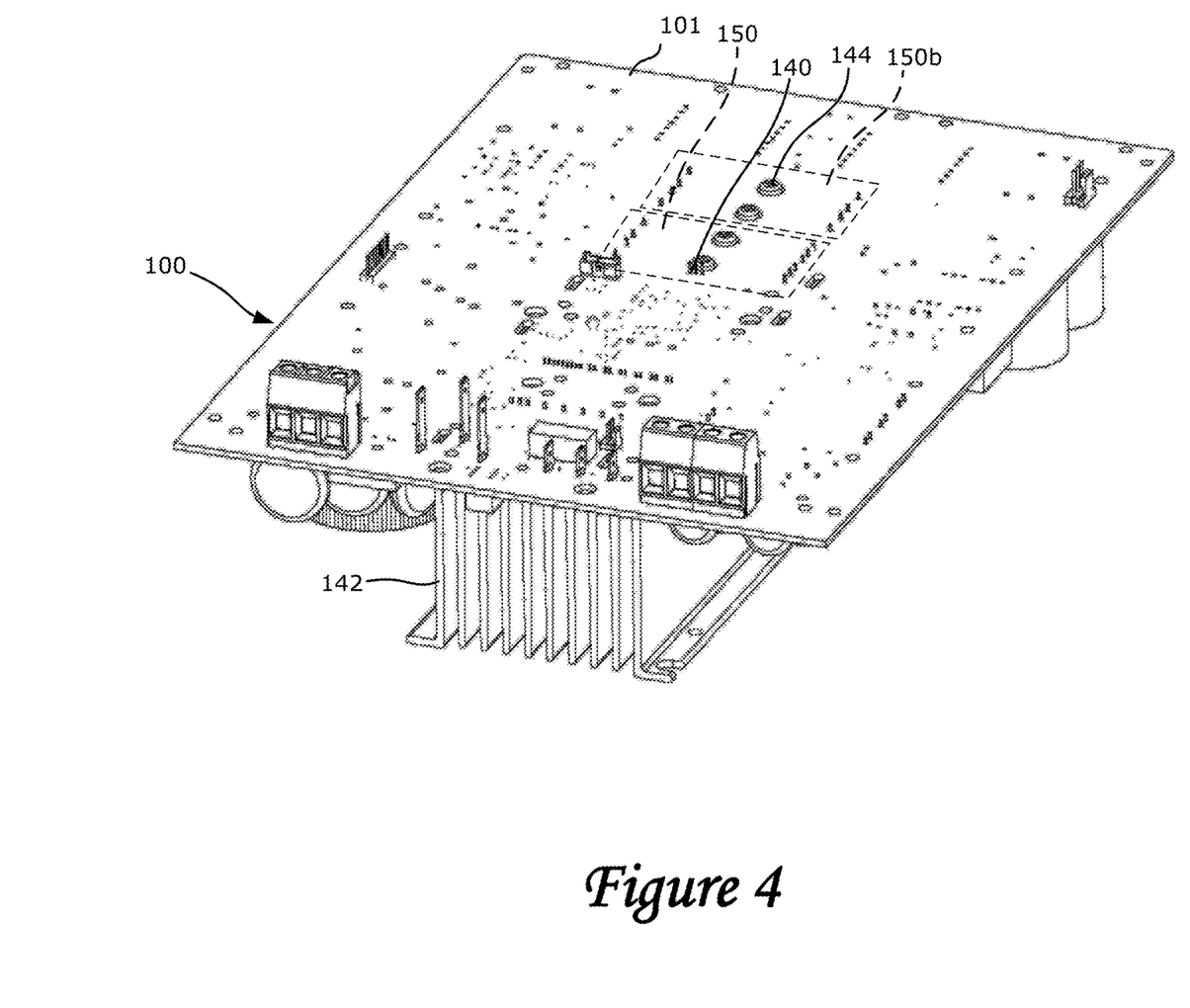
FIG. 4 is a bottom perspective view of an embodiment of the motor drive of FIG. 2.

FIGS. 3 and 4 are top and bottom perspective views of embodiments of motor drive comprising a heat sink 142. FIG. 3 illustrates an embodiment of a motherboard 101 with traditional rectifier 120, PFC 125, and inverter 130, while FIG. 4 illustrates of an embodiment of motherboard 101 in which rectifier 120 and PFC 125 were replaced with discrete power component assemblies 150, 150*b*. While two discrete power component assemblies 150, 150*b* are indicated, one or more than two may be attached to motherboard 101, and the component groups may be as described below or the components of each group may vary as desired for the particular purpose of each discrete power component assembly. In one variation, a discrete power component assembly includes discrete power components of a rectifier, a PFC, and an inverter. In another variation, a discrete power component assembly includes discrete power components of a rectifier and an inverter. Some components, such as the gating controller of the inverter and the inductor and/or capacitor of the PFC are positioned on the motherboard in a traditional manner. While discrete power component assemblies are described with utility in a motor drive, it should be understood that the benefits of discrete power component assemblies can be obtained in any application in which power modules are used, therefore the discrete power component assemblies described herein can be used with any control board in any application in which power components are used.

Figure 5:
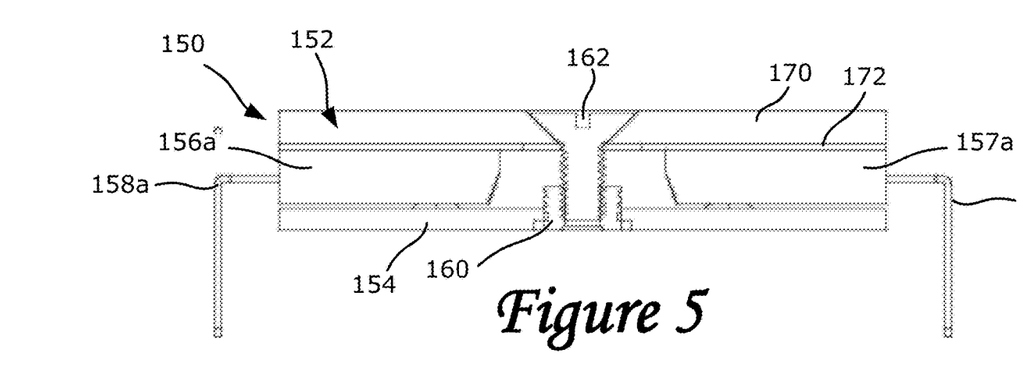
FIGS. 5 to 7 are side, assembled perspective bottom and exploded perspective bottom views of a discrete power component assembly.
Figure 6:
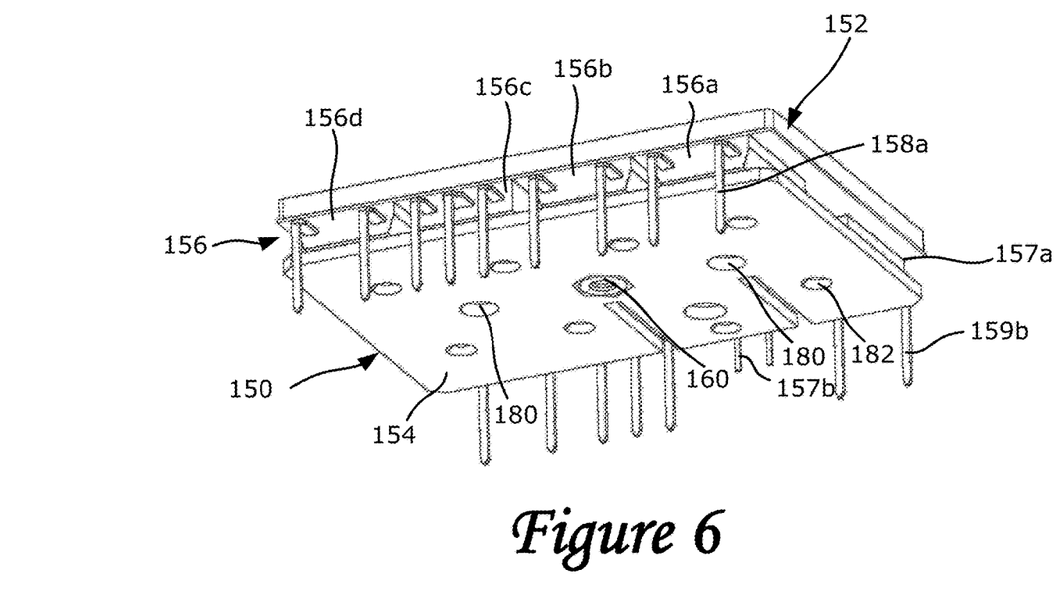
Figure 7:
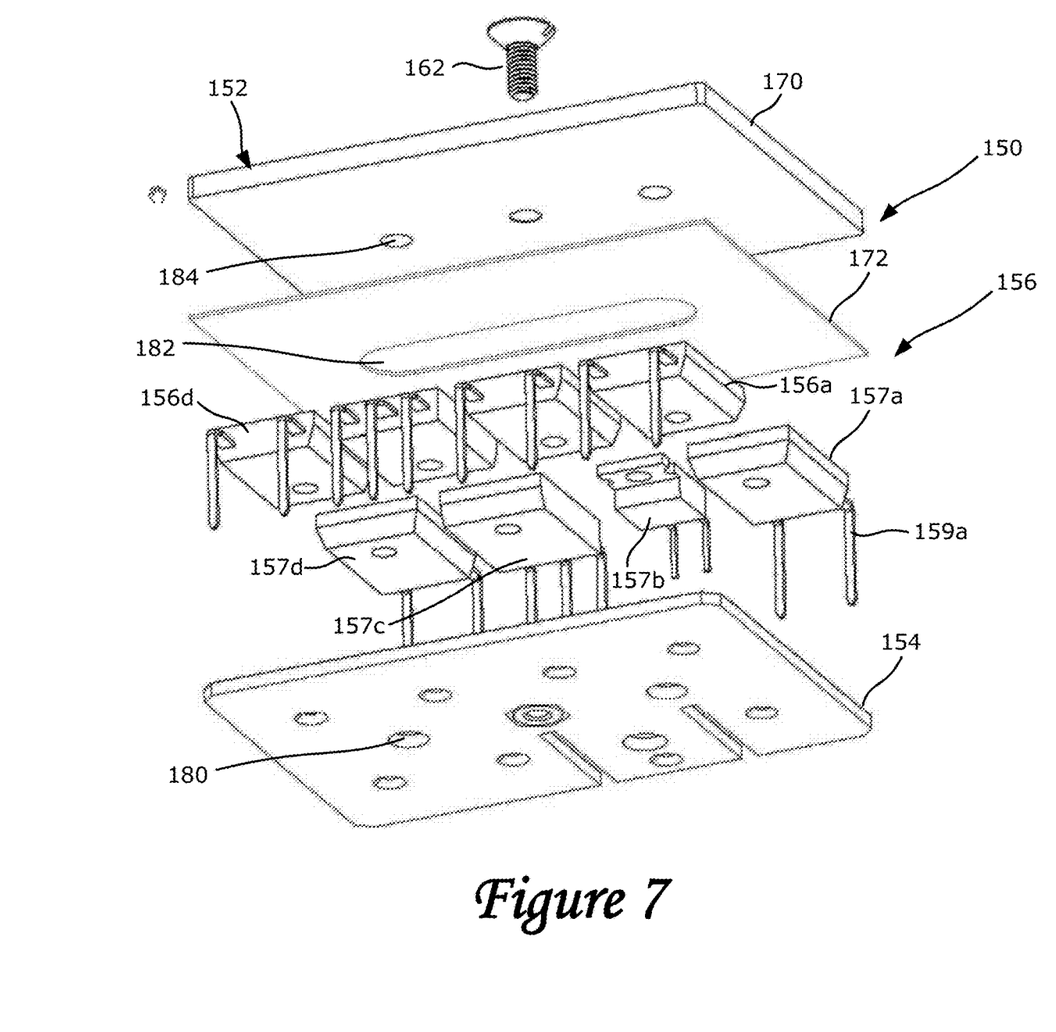
Figure 11:
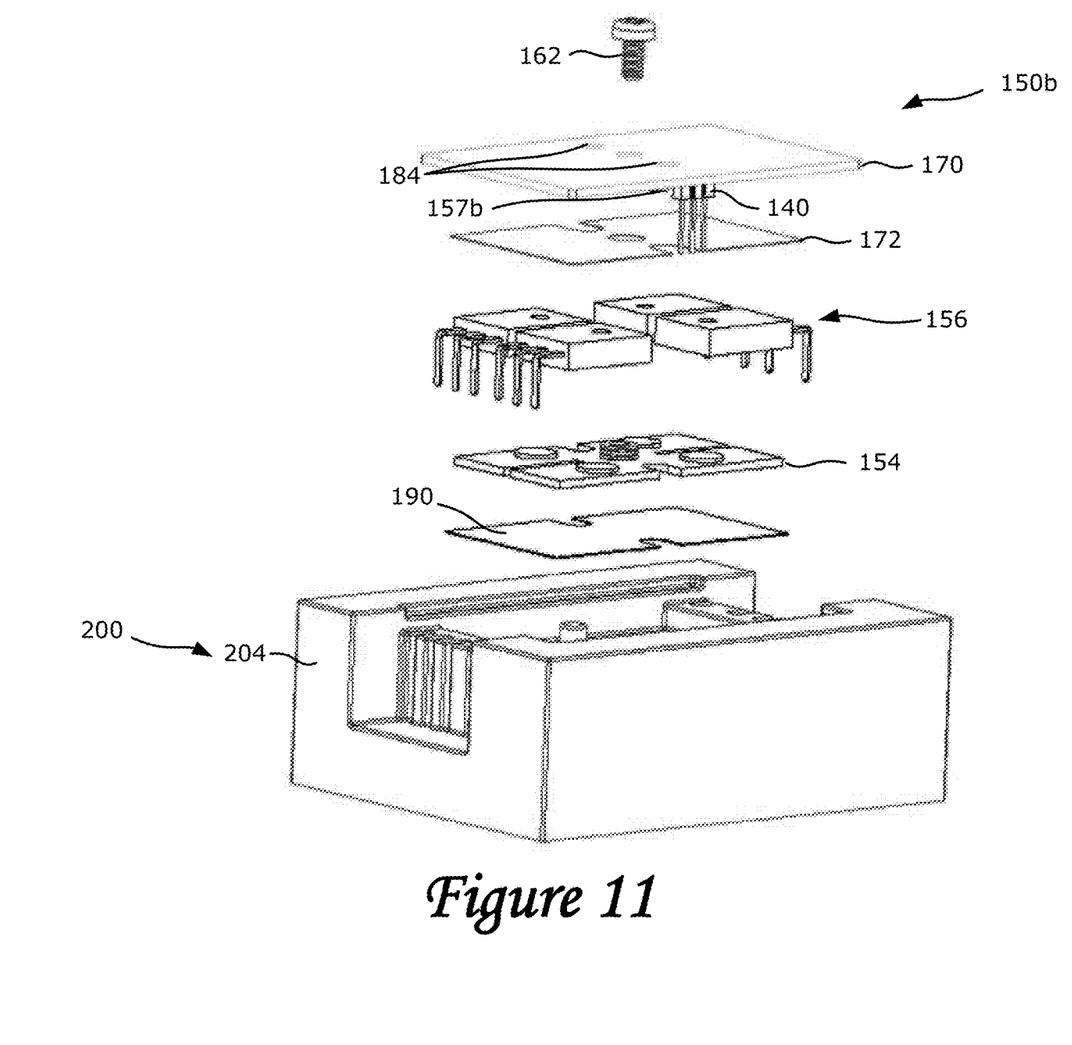
Figure 12:
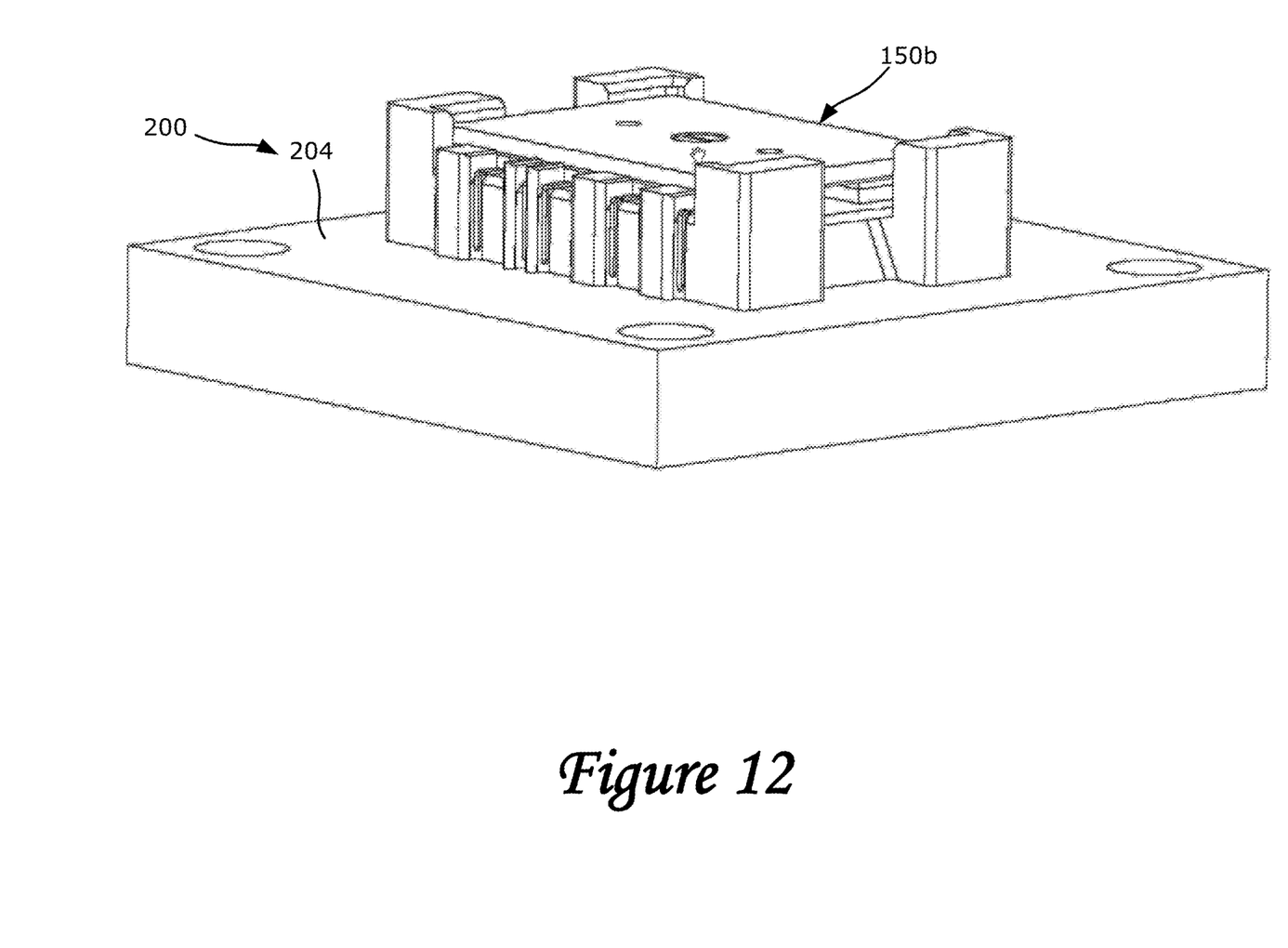

FIGS. 5 to 7 are side, assembled perspective bottom and exploded perspective bottom views of a discrete power component assembly 150 comprising a heat-sink facing plate 152, a component group 156 including components 156*a*-156*d* and 157*a*-157*d*, each of the components including bent leads (e.g. 158*a*, 159*b*), and a motherboard facing plate 154. Heat sink facing plate 152 and motherboard facing plate 154 are secured together with a threaded grommet 160 permanently attached to motherboard facing plate 154 and a screw 162 secured to threaded grommet 160, with the discrete power components therebetween. As best seen in FIG. 7, the discrete power components (e.g. 156*a*-*d* and 157*a*-*d*) have planar surfaces and a thickness therebetween, the planar surfaces adjacent planar surfaces of heat sink facing plate 152 and motherboard facing plate 154. The planar surfaces of the discrete power components may be in direct contact with the planar surfaces of heat sink facing plate 152 and motherboard facing plate 154, or in indirect contact if an adhesive, phase change material, or other layer is interposed between them. Of course the plates of discrete power component assembly 150 can be secured together by other means, including snap-on stand-offs made of polymer, metal or other materials. Discrete power component assemblies 150, 150*b* are secured to motherboard 101 by soldering of the discrete power component leads. Traces to connect leads of discrete power components to form various topologies can be formed in the motherboard or in either of the plates or partly on each. In the present embodiment, the leads are electrically connected on the motherboard. Motherboard facing plate 154 includes mounting holes 180 configured to secure discrete power component assembly 150, 150*b* to heat sink 142 and alignment dimples 182 configured to facilitate alignment of the components of component group 156 relative to motherboard facing plate 154. As used herein, motherboard facing plate refers to the plate towards which the leads of the components are bent, and heat sink facing plate refers to the plate on the opposite side of the components located adjacent the motherboard facing plate. In the present embodiment, heat sink facing plate 152 includes a metal substrate 170 and a thermal interface layer 172. In one example, metal substrate 170 comprises a thermal clad layer of an aluminum substrate and a copper tracing layer, with a dielectric layer therebetween. The copper tracing layer enables surface-mounting of some components, if desired, while the dielectric electrically insulates the aluminum substrate. Examples of thermal interface layers include a thermal silicone heat sink compound, a thermal compound paste, a thermal double side adhesive tape, and a thermal interface phase change pad. In a preferred embodiment, a thermal interface phase change pad is used, which is easy to use during the assembly process and removes air gaps caused by surface imperfections. In a preferred embodiment, heat sink facing plate 152 comprises a thermal clad layer of an aluminum substrate, a dielectric layer and a copper tracing layer, and a thermal interface phase change pad. As shown in FIG. 7, some components have two leads, e.g. diodes, and some have three leads, e.g. power switches such as IGBTs. In one example, a thermistor 157*b* is provided to determine a temperature of discrete power component assembly 150. Thermistor 157*b* can be surface-mounted with leads connected via copper traces to a connector 140, as shown on FIGS. 4 and 11, and can also be mounted parallel to discrete power components, as shown in FIGS. 6 and 7. In the present example discrete power component assembly 150 is structured as a PFC, e.g. PFC 125, and discrete power component assembly 150*b* is structured as a rectifier, e.g. rectifier 120.

Figure 8:
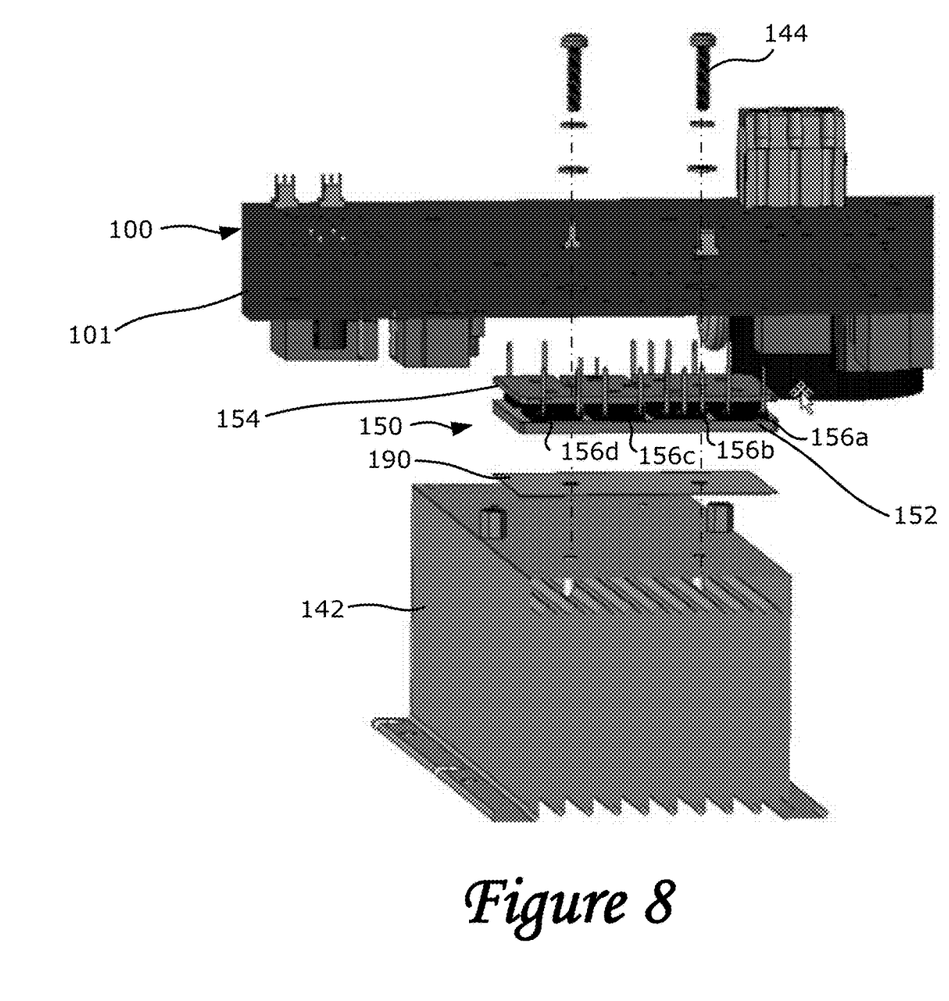
FIGS. 8 and 9 are top perspective and side views of the motor drive of FIG. 2 including the embodiment of the discrete power component assembly depicted in FIGS. 5 to 7.
Figure 9:
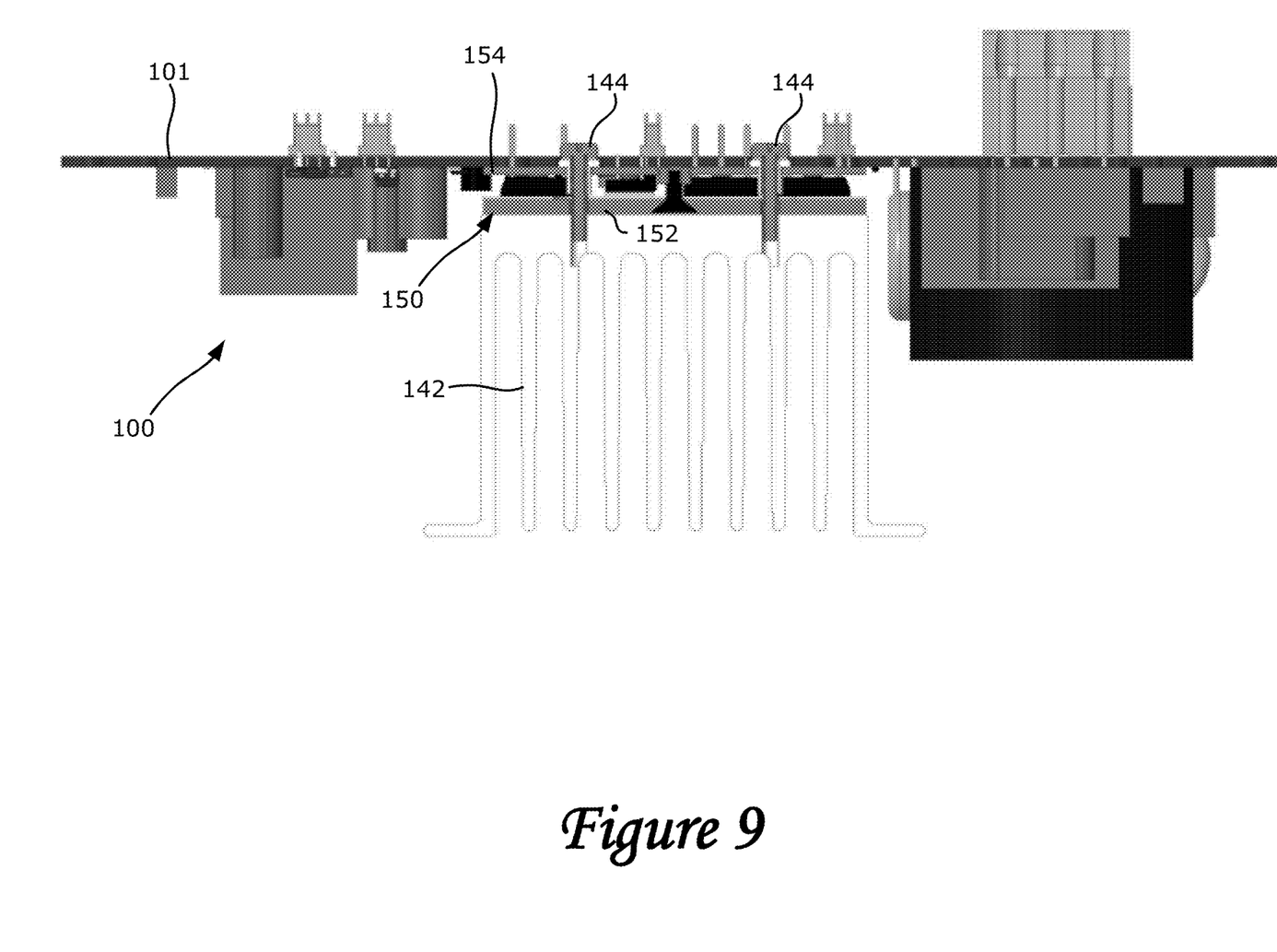

FIGS. 8 and 9 are top perspective and side views of motor drive 100 including the embodiment of discrete power component assembly 150 depicted in FIGS. 5 to 7. As shown, a thermal interface layer 190 is interposed between discrete power component assembly 150 and heat sink 142 to enhance heat transfer from discrete power component assembly 150 to heat sink 142 and heat dissipation therefrom. In other examples, thermal interface layer 190 is assembled with discrete power component assembly 150. Thermal interface layer 190 may be the same or different from thermal interface layer 172. As shown, screws 144 secure discrete power component assembly 150 and heat sink 142. Thermistor 157b may be placed on either or both of discrete power component assemblies 150 and 150b.

Figure 10:
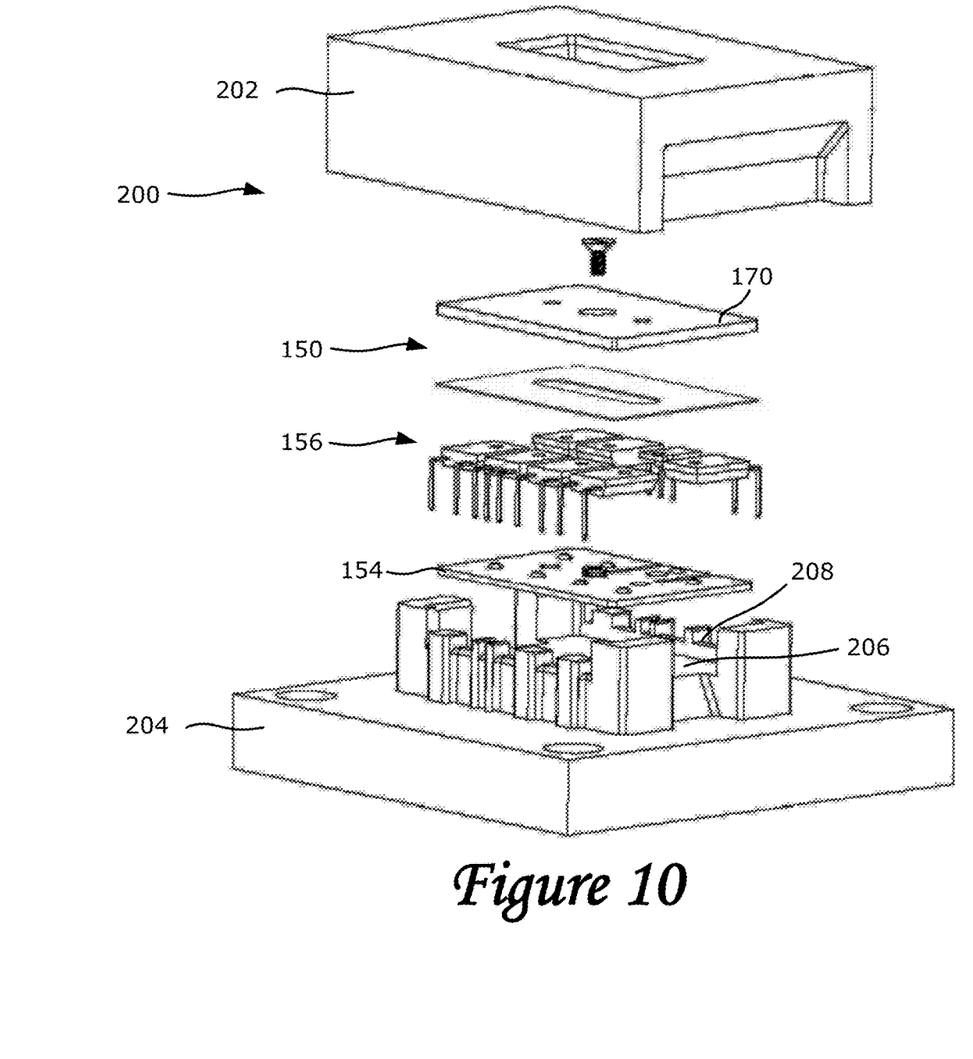
FIGS. 10 to 12 perspective views of a fixture used to assemble discrete power component assemblies in accordance with the method described with reference to FIG. 13.

Having described motor drive 100 in detail, including assembly of discrete power component assembly 150, a method 240 of assembling discrete power component assembly 150 will now be described with reference to FIGS. 10 to 13. In these figures a second example of a discrete power component assembly, denoted by numeral 150b, will also be shown. Referring to FIG. 10, at 242 the members of discrete power component assembly 150 are organized and aligned in a fixture 200 including a top fixture 202 and a bottom fixture 204. Bottom fixture 204 includes a pressure surface 206 and support surfaces 208, Fixture 202 includes (not shown) another pressure surface and bending surfaces, An adhesive may be used to bond the components of component group 156 to heat-sink facing plate 152. The planar surfaces of the heat sink facing plate and the motherboard facing plate are pressed by the pressure surfaces. The support surfaces support the leads of the discrete power components while the bending surfaces, which extend outwardly from the support surfaces, bend the leads.

Figure 13:
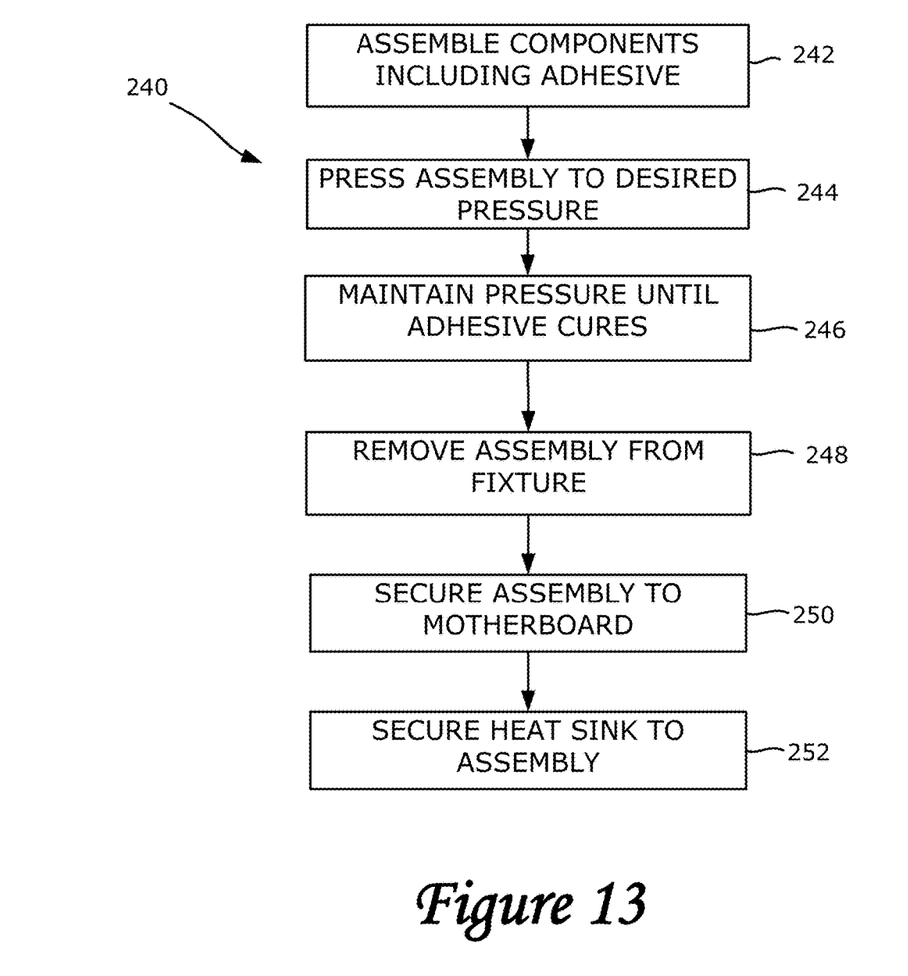
FIG. 13 is a flowchart of an embodiment of a method to assemble the motor drive of FIG. 2.

At 244, fixture 202 is lowered onto fixture 204 and during said lowering bending surfaces of fixture 202 press down on the component leads, bending them to a desired angle, e.g. 90 degrees. Fixture 202 and fixture 204 are then pressed together to a desired pressure. At 246 the pressure is maintained for a period of time sufficient for the adhesive to set.

At 248 discrete power component assembly 150 is removed from fixture 200 and at 250 discrete power component assembly 150 is secured to motherboard 101 by soldering the leads and at 252 to heat sink 142 by screws 144.

In one variation, the heat sink facing plate and the discrete power components are positioned in the fixture for bonding the discrete power components and bending the leads, and the motherboard facing plate is attached after the bonded structure is removed from the fixture.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A motor drive comprising:
a motherboard;
a controller mounted on the motherboard;
a heat sink; and
a discrete power component assembly mounted to the motherboard, the discrete power component assembly including:
two discrete power components,
a motherboard facing plate intermediate the motherboard and the two discrete power components, the motherboard facing plate adjacent planar surfaces of the two discrete power components; and
a heat sink facing plate adjacent planar surfaces of the two discrete power components which are opposite the planar surfaces adjacent the motherboard facing plate, wherein the heat sink facing plate and the motherboard facing plate are secured to each other to hold the two discrete power components therebetween,
wherein the discrete power component assembly is positioned between the heat sink and the motherboard.

2. The motor drive of claim 1, wherein the heat sink facing plate comprises a metal substrate, the motor drive further comprising a thermal interface layer in contact with the metal substrate.

3. The motor drive of claim 2, wherein the metal substrate comprises an aluminum plate, the motor drive further comprising a dielectric layer bonded to the aluminum plate.

4. The motor drive of claim 3, wherein the metal substrate further comprises a copper tracing layer.

5. The motor drive of claim 1, further comprising a thermal interface layer between the discrete power component assembly and the heat sink.

6. The motor drive of claim 1, wherein the two discrete power components comprise a plurality of discrete power switches configured in an inverter topology, and wherein the motherboard comprises the controller configured to generate gating signals to control the power switches.

7. The motor drive of claim 1, wherein each of the two discrete power components comprises an individually packaged power switch.

8. The motor drive of claim 1, wherein the discrete power component assembly comprises four diodes, further comprising a second discrete power component assembly comprising two diodes and two power switches.

9. The motor drive of claim 8, wherein the four diodes are arranged in a rectifier topology, and wherein the two diodes and the two power switches are arranged in a power factor correction circuit topology.

10. A method of making motor drive, the method comprising:
bonding two discrete power components to a heat sink facing plate with a thermal interface layer therebetween;
securing a motherboard facing plate and the heat sink facing plate to each other to hold the two discrete power components therebetween, the heat sink facing plate, the motherboard facing plate, and the two discrete power components forming a discrete power component assembly;
electrically connecting leads of the two discrete power components to a motherboard to attach the discrete power component assembly to the motherboard; and
securing a heat sink to the discrete power component assembly with a thermal interface layer therebetween,
wherein bonding two discrete power components to a heat sink facing plate is performed by pressing a top fixture and a bottom fixture with the two discrete power components and the heat sink facing plate therebetween, and with an adhesive layer between each of the two discrete power components and the heat sink facing plate.

11. The method of claim 10, further comprising supporting leads of the two discrete power components with the top fixture or the bottom fixture and bending the leads with the other of the top fixture or the bottom fixture.

* * * * *